(12) United States Patent
Yin et al.

(10) Patent No.: US 9,384,986 B2
(45) Date of Patent: Jul. 5, 2016

(54) DUAL-METAL GATE CMOS DEVICES AND METHOD FOR MANUFACTURING THE SAME

(75) Inventors: Huaxiang Yin, Beijing (CN); Zuozhen Fu, Beijing (CN); Qiuxia Xu, Beijing (CN); Dapeng Chen, Beijing (DE)

(73) Assignee: NSITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/396,845

(22) PCT Filed: May 17, 2012

(86) PCT No.: PCT/CN2012/075685
§ 371 (c)(1),
(2), (4) Date: Oct. 27, 2014

(87) PCT Pub. No.: WO2013/159414
PCT Pub. Date: Oct. 31, 2013

(65) Prior Publication Data
US 2015/0102416 A1    Apr. 16, 2015

(30) Foreign Application Priority Data
Apr. 27, 2012 (CN) .......................... 2012 1 0129587

(51) Int. Cl.
*H01L 21/28* (2006.01)
*H01L 29/66* (2006.01)
(Continued)

(52) U.S. Cl.
CPC .......... *H01L 21/28088* (2013.01); *H01L 21/28* (2013.01); *H01L 21/28008* (2013.01); *H01L 21/28026* (2013.01); *H01L 21/28044* (2013.01); *H01L 21/28079* (2013.01); *H01L 21/82345* (2013.01); *H01L 21/823842* (2013.01); *H01L 27/092* (2013.01); *H01L 27/0928* (2013.01); *H01L 29/517* (2013.01); *H01L 29/66515* (2013.01); *H01L 29/66545* (2013.01)

(58) Field of Classification Search
CPC ................... H01L 29/66409; H01L 29/66515; H01L 29/66545; H01L 21/28; H01L 21/28008; H01L 21/28026; H01L 21/28044; H01L 21/28079; H01L 21/28088
See application file for complete search history.

(56) References Cited

U.S. PATENT DOCUMENTS 7,601,577 B2   10/2009   Chamebers et al.
2006/0006522 A1   1/2006   Doczy et al.
(Continued)

FOREIGN PATENT DOCUMENTS

CN   101076888 A   11/2007
CN   101521180 A   9/2009

OTHER PUBLICATIONS

Search Report and First Office Action issued by China Patent Office on Oct. 28, 2014 for related Chinese Patent Application No. 201210129587.7.

*Primary Examiner* — Eduardo A Rodela
(74) *Attorney, Agent, or Firm* — Enshan Hong; VLP Law Group LLP

(57) ABSTRACT

A method for manufacturing a dual metal CMOS device comprising: forming a first type metal work function modulation layer in the first gate trench and the second gate trench; forming a second type work function metal diffusion source layer in the first gate trench and the second gate trench; forming a heat isolation layer that shields the region of the first type device; and thermally annealing the regions where the first type device and the second type device are located.

10 Claims, 10 Drawing Sheets

(51) Int. Cl.
*H01L 21/8238* (2006.01)
*H01L 21/8234* (2006.01)
*H01L 27/092* (2006.01)
*H01L 29/51* (2006.01)

(56) References Cited

U.S. PATENT DOCUMENTS

2007/0054446 A1   3/2007  Chambers et al.
2009/0039433 A1   2/2009  Yang et al.
2009/0283835 A1*  11/2009 Yu .................. H01L 21/268
                                                  257/368
2012/0068261 A1   3/2012  Kwon et al.
2012/0289040 A1*  11/2012 Huang ............ H01L 21/823842
                                                  438/591
2015/0079777 A1*  3/2015  Guo ................ H01L 21/82342
                                                  438/589

* cited by examiner

DUAL-METAL GATE CMOS DEVICES AND METHOD FOR MANUFACTURING THE SAME

CROSS REFERENCE TO RELATED APPLICATIONS

This is a U.S. national stage of international patent application No. PCT/CN2012/075685, filed on May 17, 2012. Priority is claimed on the following application: Country: China, Application No.: 201210129587.7, Filed: Apr. 27, 2012, the content of which is incorporated here by reference.

TECHNICAL FIELD

The present invention relates to a field of semiconductor technology. In particular, the present invention relates to a dual-metal gate CMOS device and a method for manufacturing the same.

BACKGROUND OF THE ART

Starting from the 45 nm CMOS IC process, as the feature size of the device increasingly shrinks, in order to suppress the short channel effect, the equivalent oxide thickness (EOT) of the gate dielectric layer must be reduced synchronously. Then, the ultra-thin conventional oxide or nitride oxide layer leads to a serious gate leakage. Therefore, the traditional poly-Si/SiON system is no longer applicable.

The appearance of a high-K gate dielectric layer effectively improves the gate leakage phenomenon of the device. However, poly-Si and high-K are combined to generate Fermi level pinning effect, which is not suitable for the threshold regulation of the MOS device. Therefore, poly-Si gates are gradually being replaced by metal gates.

For different MOS devices (i.e., PMOS devices and NMOS devices), metal gates having different work functions are required to regulate the threshold. There are many methods to form metal gates having different work functions, where the best method is to employ different metal materials to form a gate, i.e., NMOS requires a conduction band metal and PMOS requires a valence band metal. Although this method is optimal, a variety of different metal gate materials and complex integration processes are required. And the regulation scope is quite limited by employing a single metal post-process regulation method.

Therefore, the current most common method used to form a metal having different work functions is: first, as shown in FIG. 1(a), a first dummy gate stack and a second dummy gate stack, source/drain junction extensions 12a, 12b, and source/drain regions 13a, 13b are formed on the substrate 100, wherein each of the first dummy gate stack and the second dummy gate stack at least comprises a dummy gate 21a, 21b, the first dummy gate stack is used to form a gate of a first type device, and the second dummy gate stack is used to form a gate of a second type device; then, as shown in FIG. 1(b), a contact etch stop layer 30 and a first interlayer dielectric layer 40 are formed on the entire semiconductor structure; then, as shown in FIG. 1(c), part of the first interlayer dielectric layer 40 and part of the contact etch stop layer 30 are removed to expose the dummy gates 21a, 21b, and the dummy gates 21a, 21b are removed to form correspondingly a first gate trench 40a and a second gate trench 40b; then, as shown in FIG. 1(d), a first type metal layer work function modulation layer 41 is formed in the first gate trench 40a and the second gate trench 40b; then, as shown in FIG. 1(e), the first type metal layer work function modulation layer 41 located in the first gate trench 40a is removed; then, as shown in FIG. 1(f), the second type metal layer work function modulation layer 42 is deposited in the first gate trench 40a and the second gate trench 40b; then, as shown in FIGS. 1(g) and 1(h), the first gate trench 40a and the second gate trench 40b are filled with the metal material 43 to form a first gate 43a and a second gate 43b after implementing flattening operation, respectively; and finally, as shown in FIG. 1(i), in accordance with a conventional process step, a cap layer 50, a second interlayer dielectric layer 60 and a contact plug 70 are formed.

However, the above method still contains certain deficiencies:

(1) Since different CMOS devices are corresponding to metal materials with different work functions, in the CMOS integration process, it is required to deposit the first type metal layer work function modulation layer in the entire device region and then perform selective corrosion to remove the first type metal layer work function modulation layer located in the second type device region. However, selective corrosion is likely to cause damage to high-K materials on the surface of the second type device. The addition of an etch stop layer may prevent damage to high-K materials, but may correspondingly result in increase of the process complexity and undermine the ability of the metal gate work function to modulate the device threshold.

(2) The post-deposited second type metal layer deposition work function modulation layer, which is deposited simultaneously on the first type device, has some negative impacts on the threshold modulation of the first type device.

Therefore, it is desired to provide a dual metal gate CMOS device and its manufacturing method to overcome the above deficiencies.

SUMMARY OF THE INVENTION

The present invention provides a dual metal gate CMOS device and a method for manufacturing the same to solve the above problems.

According to one aspect of the invention, a method for manufacturing a dual metal gate CMOS device is provided, in which the method comprises the steps of:

a) forming a first type metal work function modulation layer in a first gate trench and a second gate trench, wherein the first gate trench is used to form a gate of a first type device and the second gate trench is used to form a gate of a second type device;

b) forming a first type work function metal diffusion source layer in the first gate trench and the second gate trench;

c) forming a gap fill metal in the first gate trench and the second gate trench;

d) forming a heat isolation layer that shields the region of the first type device;

e) thermally annealing the region in which the first type device and the second type device are located such that the metal ions in the second type work function metal diffusion source layer in the region of the second type device are diffused into the first type metal work function modulation layer, and the first type metal work function modulation layer is converted to a second type metal work function modulation layer.

According to another aspect of the invention, a dual metal gate CMOS device is further provided, comprising:
a substrate, and a first gate stack and a second gate stack on the substrate, wherein: the first gate stack includes successively a gate dielectric layer, a first type metal work function modulation layer and a first gate in a bottom-up order;

the second gate stack includes successively a gate dielectric layer, a second type metal work function modulation layer and a second gate in a bottom-up order, characterized in that:

the second type work function metal diffusion source layer is also present between the first type metal work function modulation layer and the first gate, and between the second type metal work function modulation layer and the second gate.

The present invention provides a technical solution which has the following advantages:

(1) depositing a first type metal work function modulation layer and a second type work function metal diffusion source layer on the entire device region successively, and then using a heat isolation layer (or together with a metal diffusion barrier layer) to protect the region of the first type device such that in the subsequent thermal annealing process, only the second type work function metal diffusion source layer in the region of the second type device is diffused, wherein the metal ions are diffused to the first type metal work function modulation layer thereunder, thereby changing the work function of the first metal work function modulation layer, which allows it suitable for a metal work function modulation layer of a second type device. Therefore, there is no need for the present invention to selectively corrode the first type metal work function modulation layer according to the manner in the prior art, thereby avoiding causing damage to the high K dielectric layer in the second type device.

(2) Since the second type metal work function modulation layer is converted from the first metal work function modulation layer, there is no need to deposit the second type metal work function modulation layer on the first type metal work function modulation layer according to the manner in the prior art, thus avoiding negative impact of one type of metal work function modulation layer on the threshold modulation of another type of device.

(3) The process is simple, which facilitates the manufacture.

DESCRIPTION OF THE DRAWINGS

Other characteristics, objectives and advantages of the present invention will become more obvious after reading the detailed description of the non-limiting embodiments with reference to the following attached drawings, in which.

DETAILED DESCRIPTION OF THE INVENTION

Exemplary embodiments of the present disclosure will be described in more details.

Some embodiments are illustrated in the attached drawings, in which the same or similar reference numbers represent the same or similar elements or the components having the same or similar functions. The following embodiments described with reference to the drawings are only exemplary for explaining the present invention, and therefore shall not be construed as limiting the present invention. The disclosure below provides many different embodiments or examples to implement different structures of the present invention. In order to simplify the disclosure of the present invention, components and settings of specific examples are described below. Obviously, they are merely exemplary, and are not intended to limit the present invention. In addition, reference numbers and/or letters can be repeated in different examples of the invention. This repetition is used only for brevity and clarity, and does not indicate any relationship between the discussed embodiments and/or settings. Furthermore, the invention provides a variety of specific examples of processes and materials, but it is obvious to a person skilled in the art that other processes can be applied and/or other materials can be used. In addition, the following description of a structure where a first feature is "on" a second feature can comprise examples where the first and second features are in direct contact, and also can comprise examples where additional features are formed between the first and second features so that the first and second features may not be in direct contact.

Figure 1A:
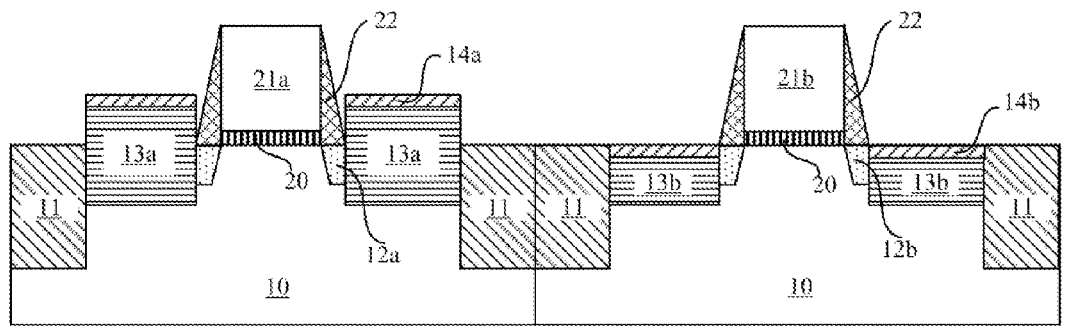
FIG. 1(a) to FIG. 1(i) are schematic cross-sectional views showing the stages of forming CMOS devices of metal gates having different work functions in the prior art.
Figure 1B:
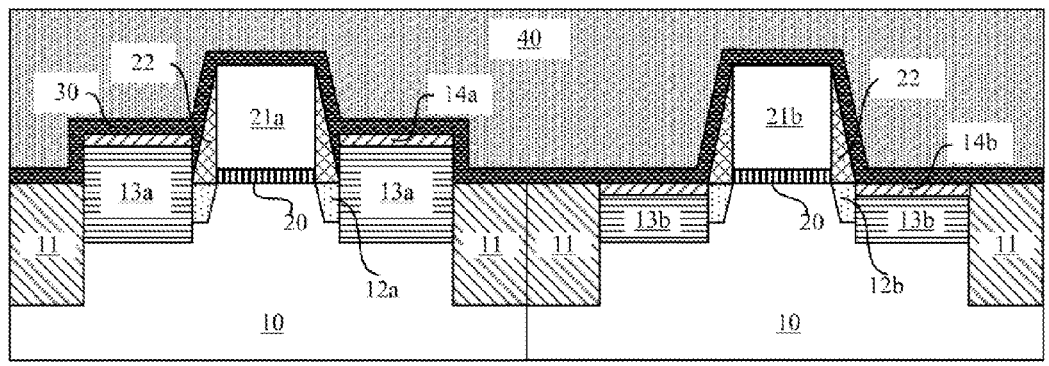
Figure 1C:
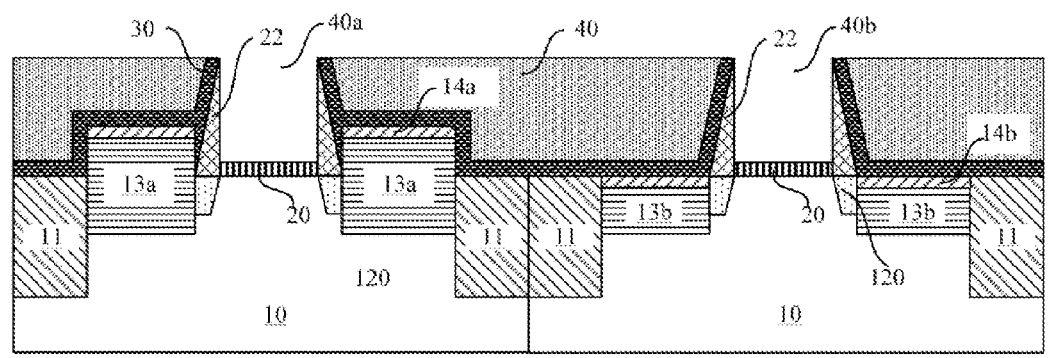
Figure 1D:
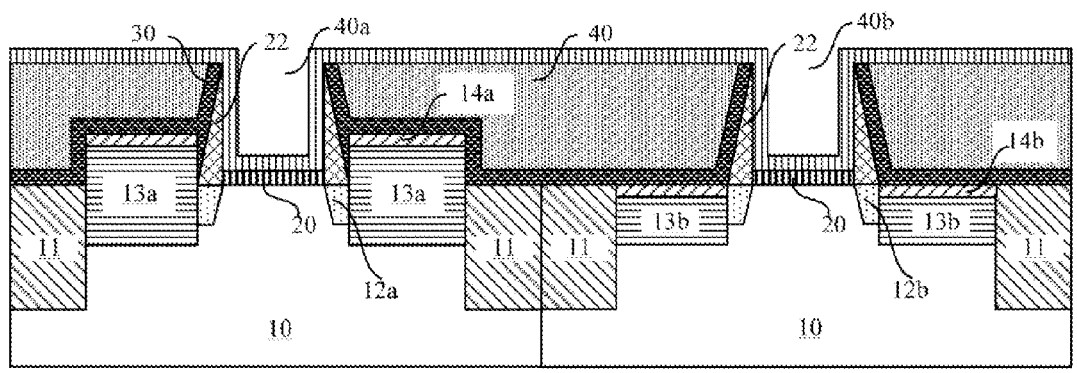
Figure 1E:
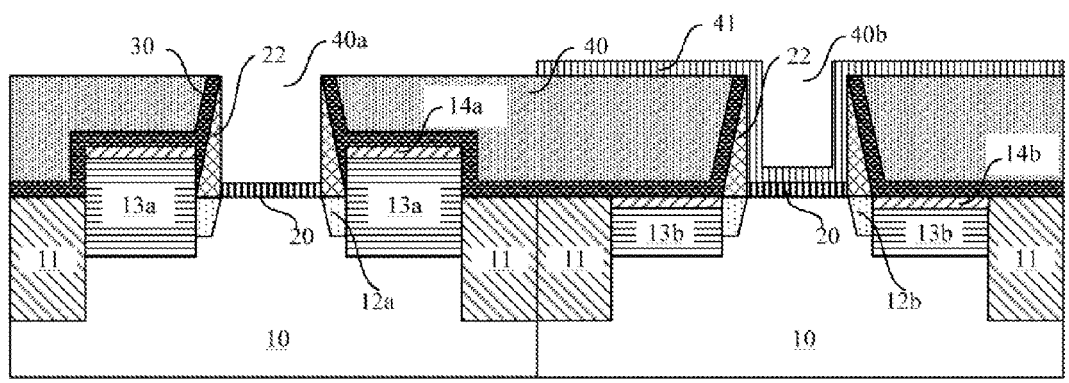
Figure 1F:
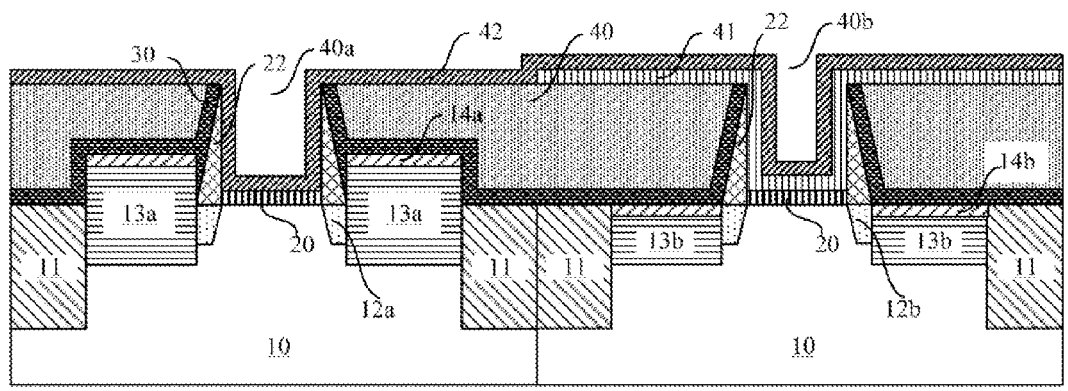
Figure 1:
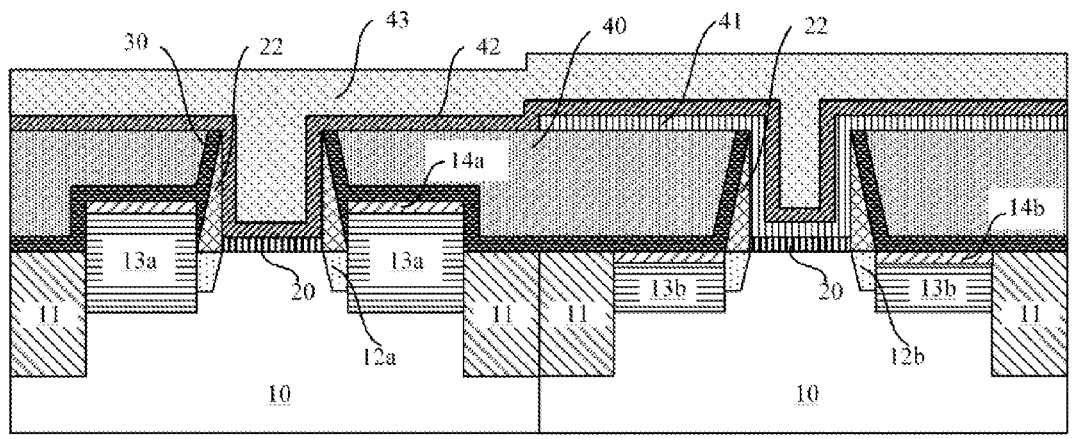
Figure 1H:
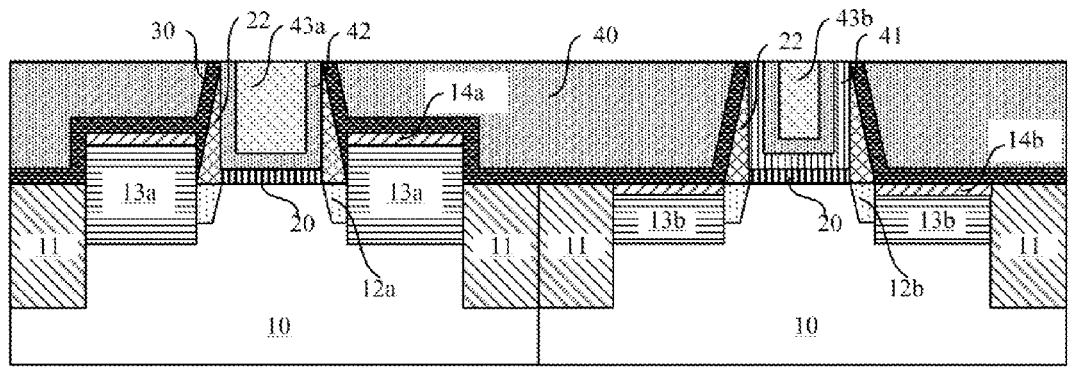
Figure 1:
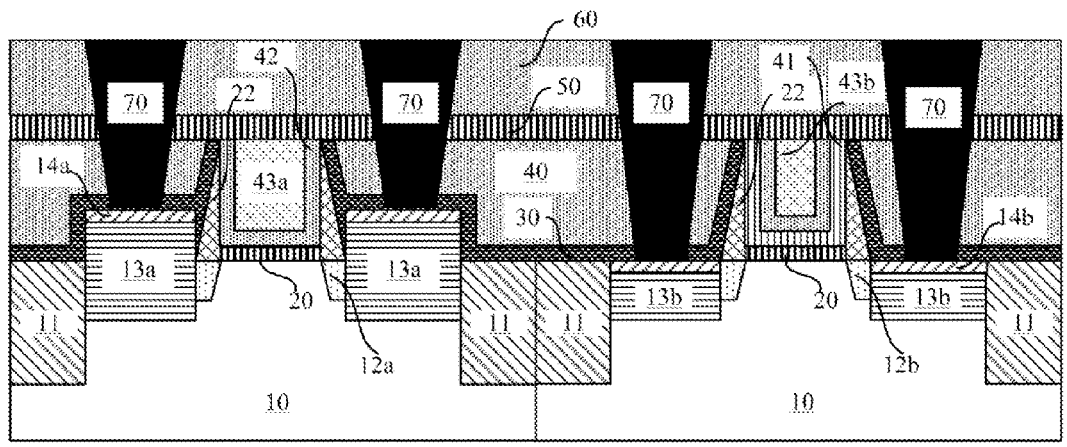
Figure 2:
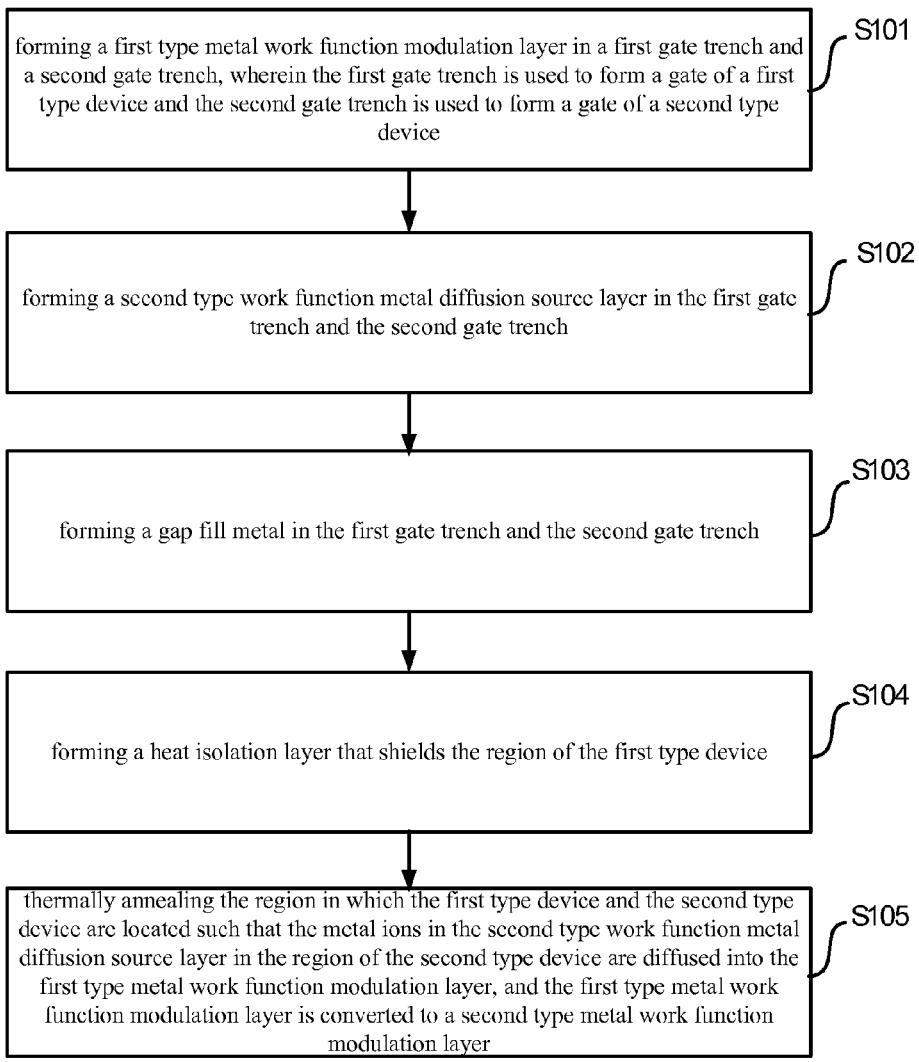
FIG. 2 is a schematic flow chart showing a method for manufacturing CMOS devices of metal gates having different work functions according to the present invention.

According to one aspect of the invention, a method for manufacturing a CMO device of a metal gate having different work functions is provided. The method for forming a CMO device of a metal gate having different work functions in FIG. 2 will be illustrated in detail with reference to a preferred embodiment according to the invention in combination with FIG. 3(a) to FIG. 3(k). As shown in FIG. 2, the manufacturing method provided herein comprises the following steps.

In step S101, a first type metal work function modulation layer 500 is formed in the first gate trench 400a and a second gate trench 400b, wherein the first gate trench 400a is used to form a gate of a first type device and the second gate trench 400b is used to form a gate of a second type device.

Formation of the first gate trench 400a and the second gate trench 400b is described prior to the detailed description of the step S101.

Figure 3A:
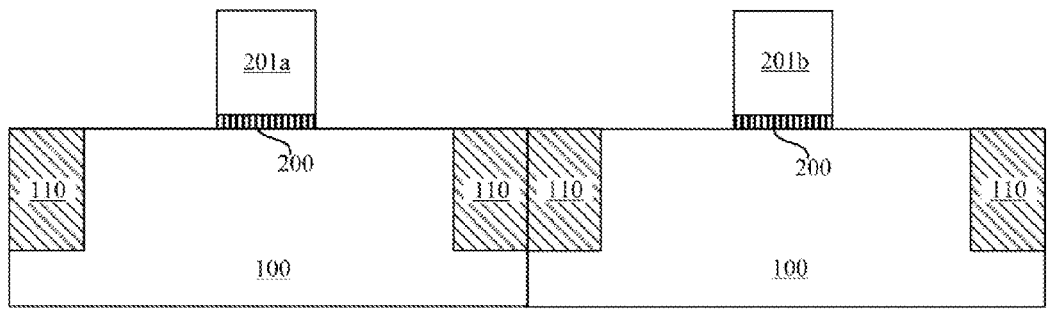
FIG. 3(a) to FIG. 3(k) are schematic cross-sectional views of a preferred embodiment showing the stages of manufacturing CMOS devices of metal gates having different work functions according to the flow chart shown in FIG. 2.

As shown in FIG. 3(a), a substrate 100 is first provided. In this embodiment, the substrate 100 is a silicon substrate (for example, a silicon wafer). According to the design requirement generally known in the art (for example, P-type substrate or N-type substrate), substrate 100 may comprise various doping configurations. In other embodiments, the substrate 100 may comprise other basic semiconductors (such as materials of Groups III-V), e.g., germanium. Alternatively, the substrate 100 may comprise compound semiconductors such as silicon carbide, gallium arsenide, and indium arsenide. Typically, the substrate 100 may have, but not limited to, a thickness of about a few hundred microns, for example, a thickness in the range of 400 μm to 800 μm.

Then, an isolation region is formed in the substrate 100, e.g., a shallow trench isolation (STI) structure 110 to facilitate electrical isolation of a continuous field-effect transistor device.

Figure 3B:
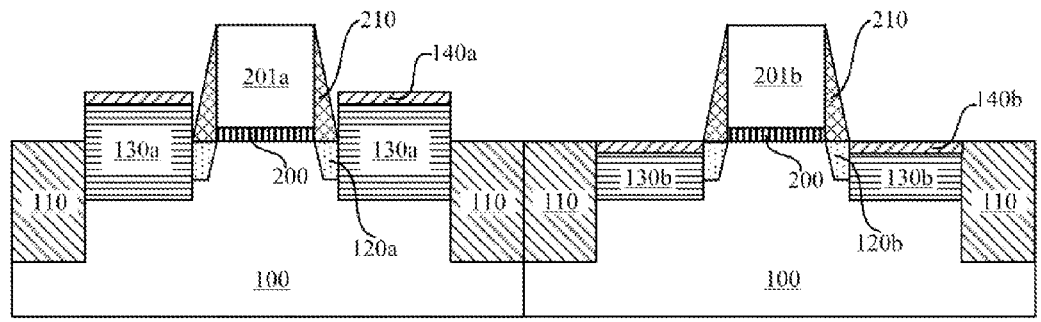

As shown in FIG. 3(b), a first dummy gate stack and a second dummy gate stack are formed on the substrate 100. In the subsequent steps, the first dummy gate stack is used to form a gate of a first type device and the second dummy gate stack is used to form a gate of a second type device. If the first type device is PMOS, then the second type device is NMOS; if the first type device is NMOS, then the second type device is PMOS. In this embodiment, the first dummy gate stack comprises a gate dielectric layer 200 and a first dummy gate 201a, and the second dummy gate stack comprises a gate dielectric layer 200 and a second dummy gate 201b. The steps of forming a first dummy gate stack and a second dummy gate stack are as follows: forming a gate dielectric layer 200 on the substrate 100. In this embodiment, the gate dielectric layer 200 is a high K dielectric, for example, one of $HfO_2$, HfSiO, HfSiON, HfTaO, HfSiO, HfZrO, HfLaO, HfLaSiO, $Al_2O_3$, $La_2O_3$, $ZrO_2$, and LaAlO, or a combination thereof, and can be formed from silicon oxide or silicon nitride, and any combination thereof in other embodiments. The gate dielectric layer 200 has a thickness in the range of 1 nm to 15 nm. Then, forming a first dummy gate 201a and a second dummy gate 201b on the gate dielectric layer 200 by means of deposition and etching, wherein the first dummy gate 201a is located in the region used for forming a first type device and the second dummy gate 201b is located in the region used for forming a second type device. The materials of the first dummy gate 201a and/or the second dummy gate 201b include polysilicon, polycrystalline SiGe, amorphous silicon, and/or doped or non-doped silicon oxide and silicon nitride, silicon oxynitride, silicon carbide, or metal. The first dummy gate 201a and/or the second dummy gate 201b have a thickness in the range of 5 nm to 200 nm.

In another embodiment, the first dummy gate stack and the second dummy gate stack can also only have a dummy gate and do not have a gate dielectric layer, and the gate dielectric layer is formed by removing the dummy gate in the subsequent replacement gate process.

As shown in FIG. 3(b), first of all, a lightly doped first source/drain junction extension 120a in the substrate 100 on both sides of the first dummy gate stack and a doped second source/drain junction extension 120b in the substrate 100 on both sides of the second dummy gate stack are formed by means of low-energy implantation with the first dummy gate stack and the second dummy gate stack as masks, respectively. Then, a spacer 210 is formed on the sidewall of the first dummy gate stack and the second dummy gate stack, wherein the spacer 210 can have a multilayer structure with a thickness in the range of 10 nm to 100 nm. The materials of the spacer 210 include but are not limited to one of silicon nitride, silicon oxide, silicon oxynitride, silicon carbide and any combination thereof. Then, the substrate 100 on both sides of the first dummy gate stack and the second dummy gate stack is etched with the spacer as a mask to form a trench, and an embedded source/drain region 130a in the trench located on both sides of the first dummy gate stack and an embedded source/drain region 130b in the trench located on both sides of the second dummy gate stack are formed. Preferably, a promotion source/drain region is further formed by means of epitaxial growth.

Preferably, the lattice constant of the material used to form a source/drain region is not equal to that of the material of the substrate 100. For PMOS devices, the lattice constant of the source/drain region is slightly greater than that of the substrate 100, thus producing compressive stress on the channel, for example, as for $Si_{1-x}Ge_x$, X ranges from 0.1 to 0.7, such as 0.2, 0.3, 0.4, 0.5 or 0.6; for NMOS devices, the lattice constant of the source/drain region is slightly less than that of the substrate 100, thus producing tensile stress on the channel, such as Si:C, wherein the atomic percentage of C ranges from 0.2% to 2%, such as 0.5%, 1% or 1.5%.

In other embodiments, the source/drain region can also be formed by means of ion implantation, which is not discussed herein.

Preferably, a first contact layer 140a is formed on the surface of the first source/drain region 130a, and/or a second contact layer 140b is formed on the surface of the second source/drain region 130b. In this embodiment, the first contact layer 140a and/or the second contact layer 140b are metal silicide layers, for example, $CoSi_2$, NiSi and the like.

Subsequently, explanation will be made by taking the example wherein the first type device is a PMOS device whereas the second type device is an NMOS device, and the source/drain regions of the two devices are embedded source/drain regions.

Figure 3C:
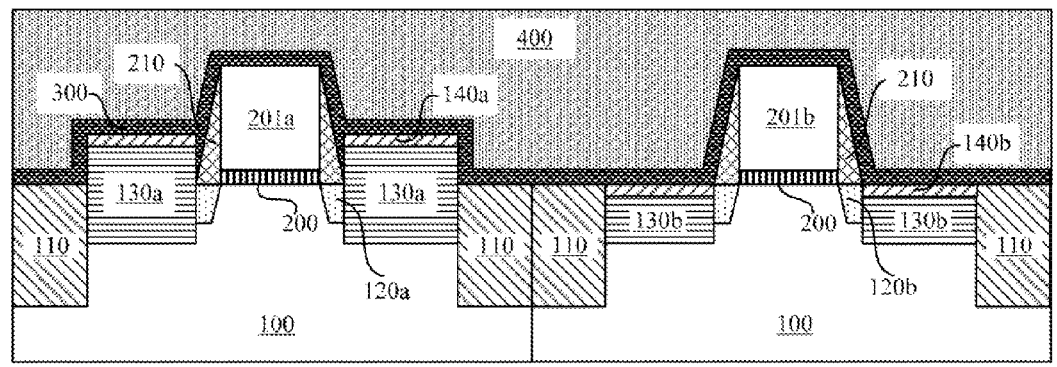

As shown in FIG. 3(c), in accordance with the conventional process, a contact etch stop layer 300 that covers the entire semiconductor structure is formed, and an interlayer dielectric layer 400 (hereinafter shown as a first interlayer dielectric layer 400) is formed on the contact etch stop layer by manners such as deposition.

Figure 3D:
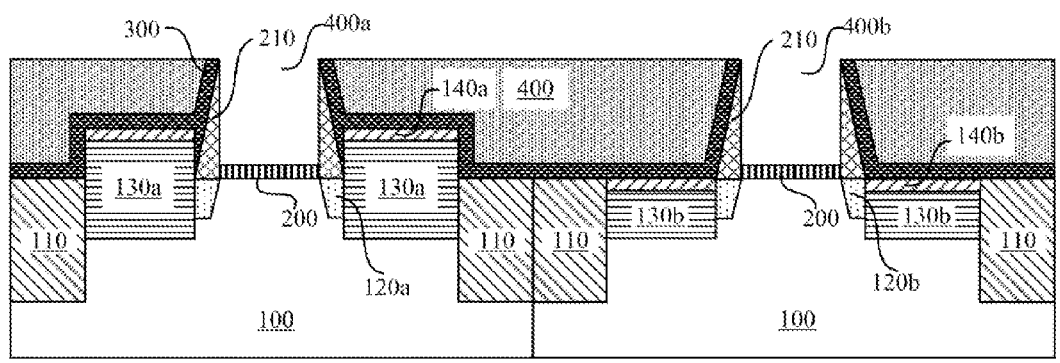

As shown in FIG. 3(d), flattening operation is conducted on the first interlayer dielectric layer 400 and the contact etch stop layer 300 until the first dummy gate 201a and the second dummy gate 201b are exposed. Then, the first dummy gate 201a and the second dummy gate 201b are removed by selective etching to correspondingly form a first gate trench 400a and a second gate trench 400b.

Step S101 is further described below.

Figure 3E:
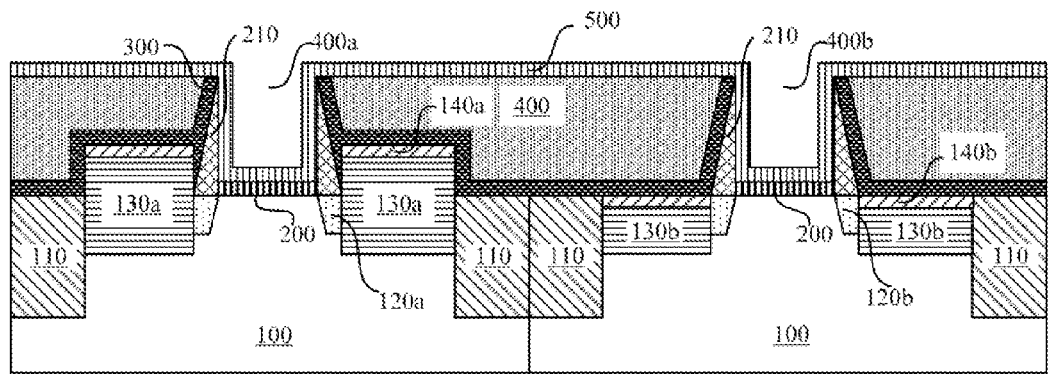

Specifically, as shown in FIG. 3(e), a first type metal work function modulation layer 500 is deposited on the surface of the entire semiconductor structure. That is, the first type metal work function modulation layer 500 covers the first interlayer dielectric layer 400, the bottom surface and sidewall of the first gate trench 400a, and the bottom surface and sidewall of the second gate trench 400b. The first type metal work function modulation layer 500 can either be a single-layer structure or a multilayer structure. The materials employed for each layer in the first type metal work function modulation layer are as follows:

(a) $M_xN_y$, $M_xSi_yN_z$, $M_xAl_yN_z$, and $MaAl_xSi_yN_z$, in which M is one of Al, Ta, Ti, Hf, Zr, Mo, W and Cu, or a combination thereof, or other appropriate metal elements;
(b) Co, Ni, Cu, Al, Pd, Pt, Ru, Re, Mo, Ta, Ti, Hf, Zr, W, Ir, Eu, Nd, Er, La, and the like;
(c) doped (a) materials with Co, Ni, Cu, Al, Pd, Pt, Ru, Re, Mo, Ta, Ti, Hf, Zr, W, Ir, Eu, Nd, Er, La, or the like implantation.

It should be noted that, when the first type metal work function modulation layer 500 is a multi-layer structure, identical or different materials can be employed for different layers. Based on the types of the first type device, the work functions of the first type metal work function modulation layer 500 are different. In this embodiment, the first type device is a PMOS device and the first type metal work function modulation layer 500 has a work function of less than 4.55 eV. In other embodiments, the first type device is an NMOS device and the first type metal work function modulation layer 500 has a work function of greater than 4.55 eV. The first type metal work function modulation layer 500 has a thickness in the range of 1 nm to 15 nm.

In step S102, a second type work function metal diffusion source layer 510 is formed in the first gate trench 400a and the second gate trench 400b.

Figure 3F:
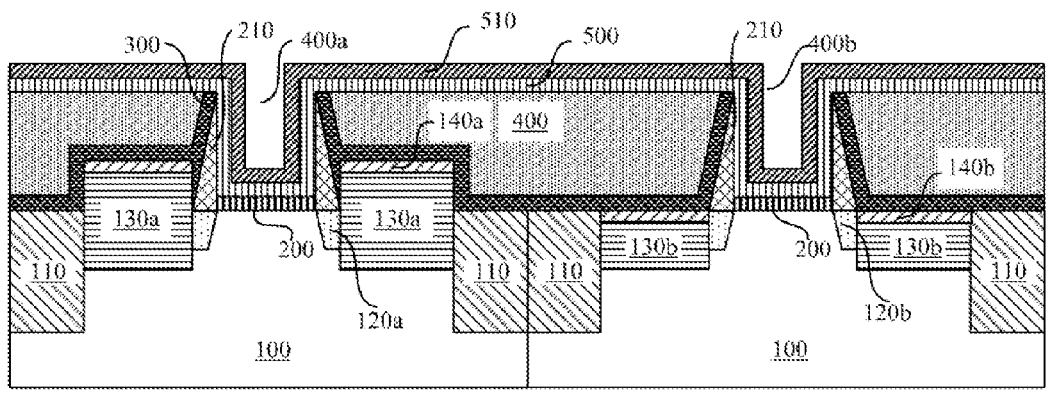

Specifically, as shown in FIG. 3(f), a second type work function metal diffusion source layer 510 is formed on the surface of the semiconductor structure by means of deposition (for example, PVD, ALD, CVD) to cover the first type metal work function modulation layer 500 located in the first gate trench 400a and the second gate trench 400b, wherein the second type work function metal diffusion source layer 510 can either be a single-layer structure or a multilayer structure. The materials employed for each layer in the second type work function metal diffusion source layer 510 are as follows:

(a) $M_xN_y$, $M_xSi_yN_z$, $M_xAl_yN_z$, and $MaAl_xSi_yN_z$, in which M is one of Al, Ta, Ti, Hf, Zr, Mo, W, Cu, or a combination thereof, or other appropriate metal elements;

(b) Co, Ni, Cu, Al, Pd, Pt, Ru, Re, Mo, Ta, Ti, Hf, Zr, W, Ir, Eu, Nd, Er, La, and the like;

(c) doped (a) materials with Co, Ni, Cu, Al, Pd, Pt, Ru, Re, Mo, Ta, Ti, Hf, Zr, W, Ir, Eu, Nd, Er, La, or the like implantation.

It should be noted that, when the second type work function metal diffusion source layer 510 is a multi-layer structure, identical or different materials can be employed for different layers.

Although the materials of the second type work function metal diffusion source layer 510 and the first type metal work function modulation layer 500 have the same selection range, the second type work function metal diffusion source layer 510 as the diffusion source has a higher concentration than that of the corresponding element in the first type metal work function modulation layer 500. For example, the first type metal work function modulation layer 500 is $Ti_{0.8}Al_{0.2}$, while the second type work function metal diffusion source layer 510 is $Ti_{0.2}Al_{0.8}$ or Al, wherein Al is a diffusion element.

The second type work function metal diffusion source layer 510 has a thickness in the range of 1 nm to 15 nm.

In step S103, a gap fill metal 520 is formed in the first gate trench 400 and the second gate trench 400b.

Figure 3G:
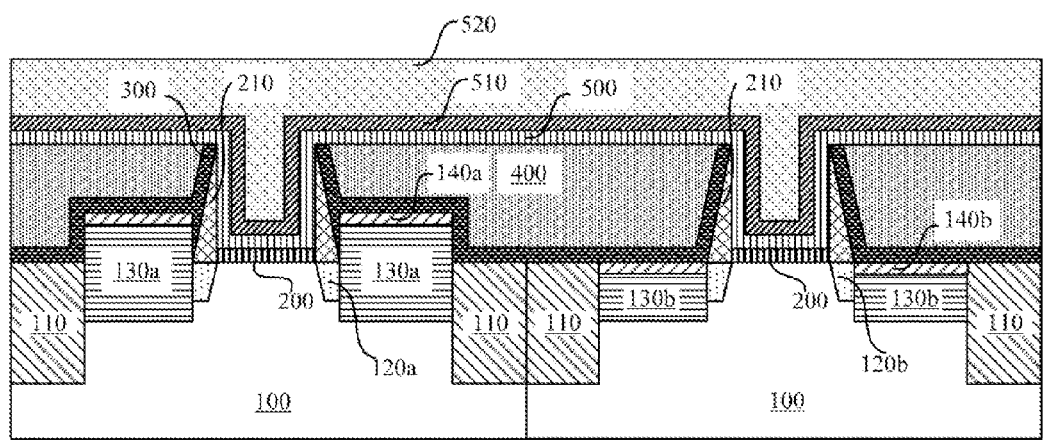

Specifically, first of all, as shown in FIG. 3(g), a gap fill metal 520 is deposited on the semiconductor structure 520 to fill the first gate trench 400a and the second gate trench 400b for forming gates of the first type device and the second type device. The materials of the gap fill metal 520 can be:

(a) $M_xN_y$, $M_xSi_yN_z$, $M_xAl_yN_z$, and $MaAl_xSi_yN_z$, in which M is one of Al, Ta, Ti, Hf, Zr, Mo, W, Cu, or a combination thereof, or other appropriate metal elements;

(b) Co, Ni, Cu, Al, Pd, Pt, Ru, Re, Mo, Ta, Ti, Hf, Zr, W, Ir, Eu, Nd, Er, La. and the like;

(c) metal alloy of Si, Ge and SiGe, such as $CoSi_2$, $TiSi_2$, NiSi, PtSi, NiPtSi, CoGeSi, TiGeSi, NiGeSi, and the like;

(d) conductors of metal oxides, such as $In_2O_3$, $SnO_2$, ITO, IZO, and the like;

(e) polycrystalline silicon, amorphous silicon, polycrystalline germanium, polycrystalline silicon-germanium, and the like;

(f) the above materials doped with other elements (such as metals and C, F, N, O, B, P, As, etc.).

Figure 3H:
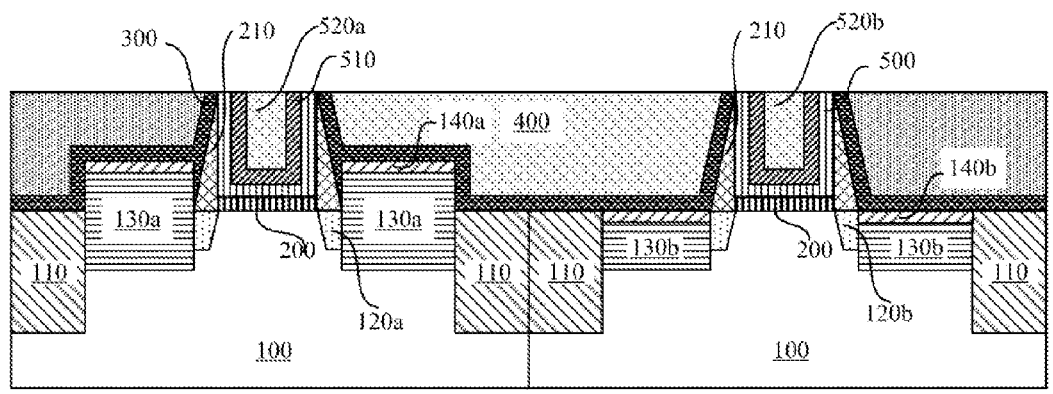

Then, as shown in FIG. 3(h), flattening operation is conducted on the gap fill metal 520 so as to expose the second type work function metal diffusion source layer 510; then, the second type work function metal diffusion source layer 510 and the first type work function metal modulation layer 500 located on the first interlayer dielectric layer 400 are removed successively by selective etching; then, part of the gap fill metal 520 is removed by controlling etching parameters such as etching time until the upper surface of the gap fill metal 520 is at the same level as that of the first interlayer dielectric layer 400, thereby forming a first gate 520a corresponding to a first type device and a second gate 520b corresponding to a second type device.

In Step S104, a heat isolation layer 530 that shields the region in which the first type device is located is formed.

Figure 3I:
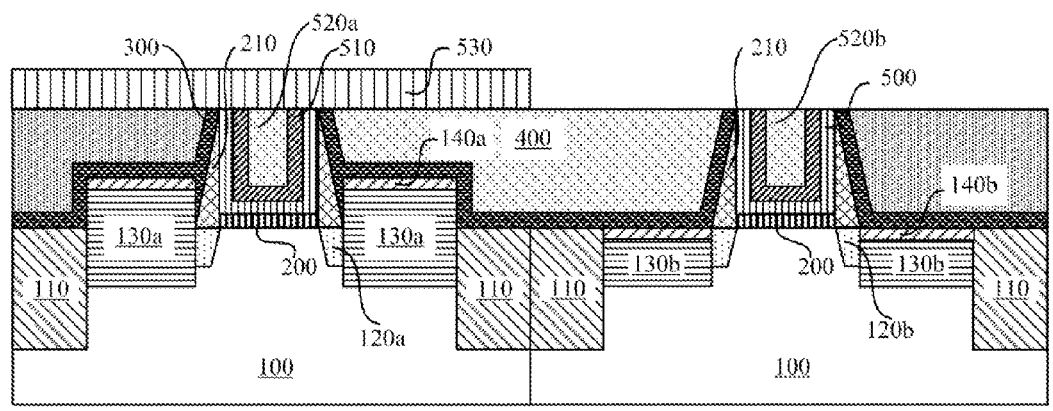

Specifically, as shown in FIG. 3(i), a heat isolation layer 530 is formed on the semiconductor structure by manners such as deposition, then the part on the region in which the second type device is located is removed and only the part on the region in which the first type device is located is retained, thus shielding the region in which the first type device is located. The materials of the heat isolation layer 530 include one of oxides, nitrides, Si:C, SiGe, amorphous silicon, polycrystalline silicon, germanium, $M_x$, $M_xN_y$, $M_xSi_yN_z$, $M_xAl_yN_z$, $MaAl_xSi_yN_z$, or any combination thereof, wherein M is Al, Ta, Ti, Hf, Zr, Mo, W or Cu. The heat isolation layer 530 has a thickness in the range of 10 nm to 5000 nm.

In step S105, the regions in which the first type device and the second type device are located are thermally annealed to diffuse the second type work function metal diffusion source layer 510 in the region wherein the first type device is located to the first type metal work function modulation layer 500, and the first type metal work function modulation layer 500 is converted to a second type metal work function modulation layer 540.

Specifically, the entire semiconductor structure is thermally annealed, wherein the thermal annealing methods include but are not limited to transient laser annealing, pulsed high-temperature annealing (the Spike RTA) or furnace annealing. The annealing temperature is in the range of 350° C. to 1250° C.

Figure 3J:
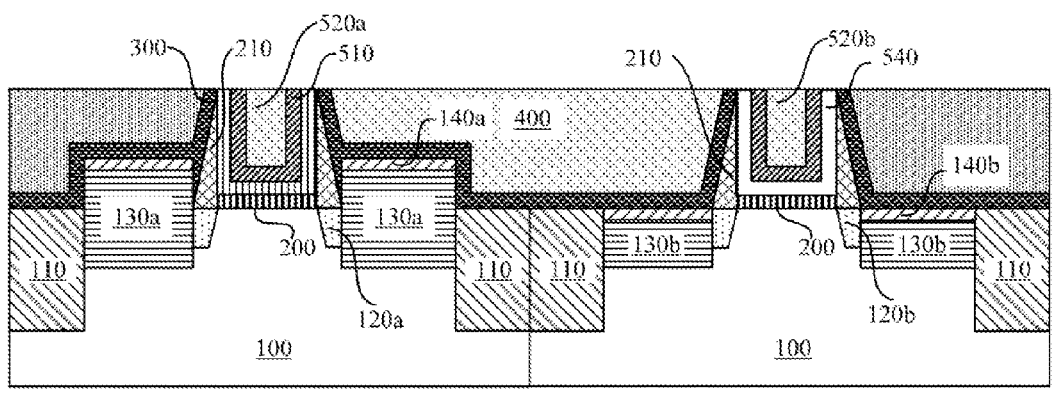

Since the second type work function metal diffusion source layer 510 in the region where the first type device is located is shielded by the heat isolation layer 530, it is substantially not affected by high temperature annealing. In contrast, the metal ions in the second type work function metal diffusion source layer 510 in the region where the second type device is located will be diffused under high temperature to enter the first type metal work function modulation layer 500 thereunder, thus changing the work function of the first type metal work function modulation layer 500 in the region of the second type device, which will be converted to a second type metal work function modulation layer 540, as shown in FIG. 3(j). That is, if the first type device is PMOS, the work function of the first type metal work function modulation layer 500 will be correspondingly reduced after diffusion, thus forming a metal work function modulation layer suitable for NMOS devices; if the first type device is NMOS, the work function of the first type metal work function modulation layer 500 will be correspondingly increased after diffusion, thus forming a metal work function modulation layer suitable for PMOS devices.

It should be noted that the second gate 520 not shielded by the heat isolation layer 530 will be phase transited under the effect of thermal annealing, while phase transition will change or improve the stress of the second gate 520b. Therefore, preferably, an appropriate gap fill metal 520 can be selected according to the specific types of the second type device such that the stress produced by the second gate 520b after phase transition will not have a negative impact on the second type device, but is beneficial to improve the performance of the second type device. For example, if the second type device is an NMOS devices, then the gap fill metal 520 is Al formed using a sputtering method, and the second gate 520b after thermal annealing has a high compressive stress, helping to improve the performance of the NMOS device; if the second type device is a PMOS device, the gap fill metal 520 is Al formed using a CVD method, and the second gate 520b after thermal annealing has a high tensile stress, helping to improve the performance of the PMOS device.

After thermal annealing, the heat isolation layer 530 is removed by selective etching.

Subsequently, the manufacture of the CMOS device is finished in accordance with the conventional semiconductor manufacturing process steps (please refer to FIG. 3(k)). Specifically, as shown in the figure, a cap layer 600 and a second interlayer dielectric layer 700 are formed on the first interlayer dielectric layer 400, and a contact plug 800 throughout the second interlayer dielectric layer 700, the cap layer 600 and the first interlayer dielectric layer 400 is formed.

Figure 4A:
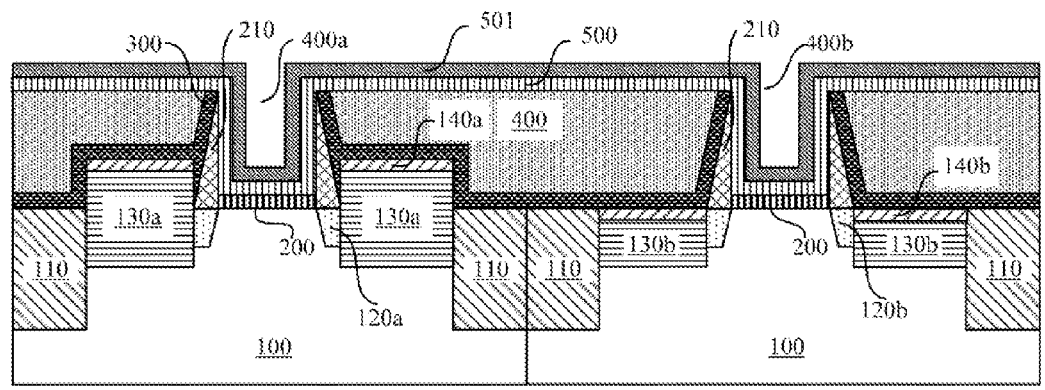
FIG. 4(a) to FIG. 4(h) are schematic cross-sectional views of another preferred embodiment showing the stages of manufacturing CMOS devices of metal gates having different work functions according to the flow chart shown in FIG. 2.
Figure 4B:
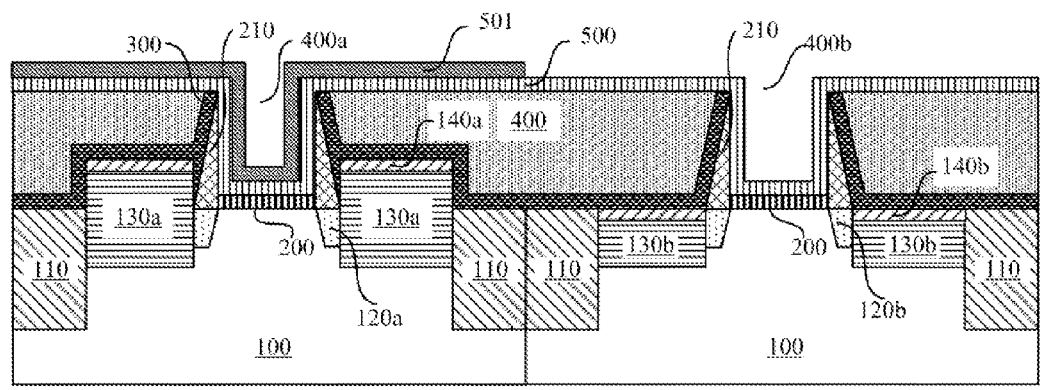
Figure 4C:
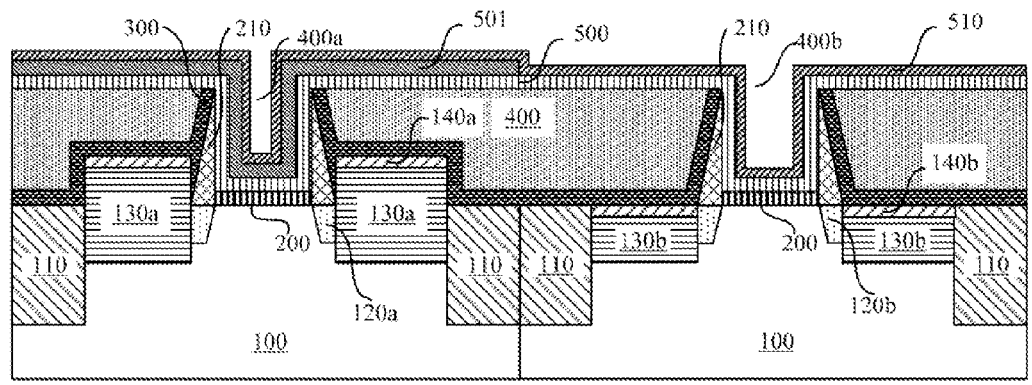
Figure 4D:
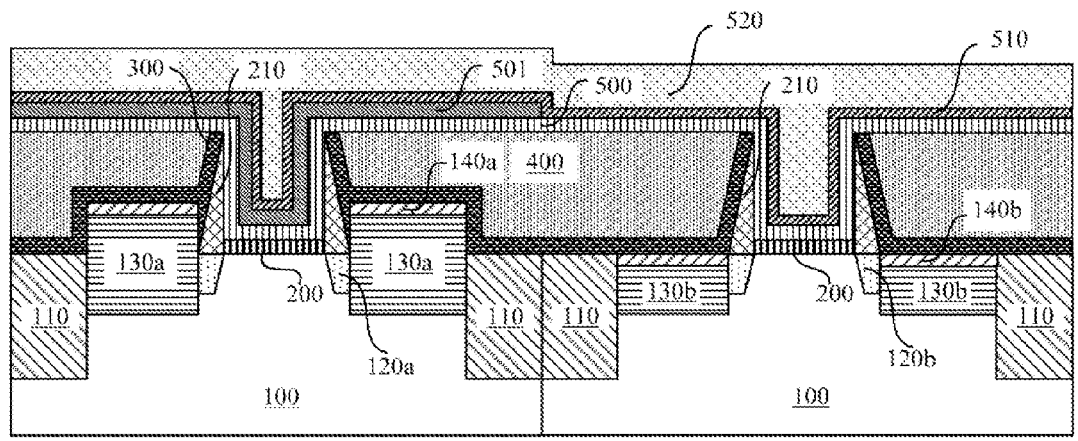
Figure 4E:
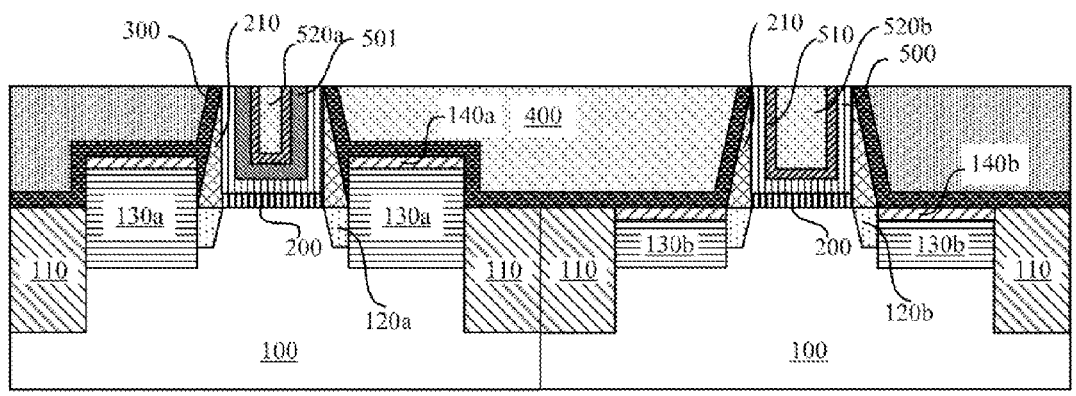
Figure 4F:
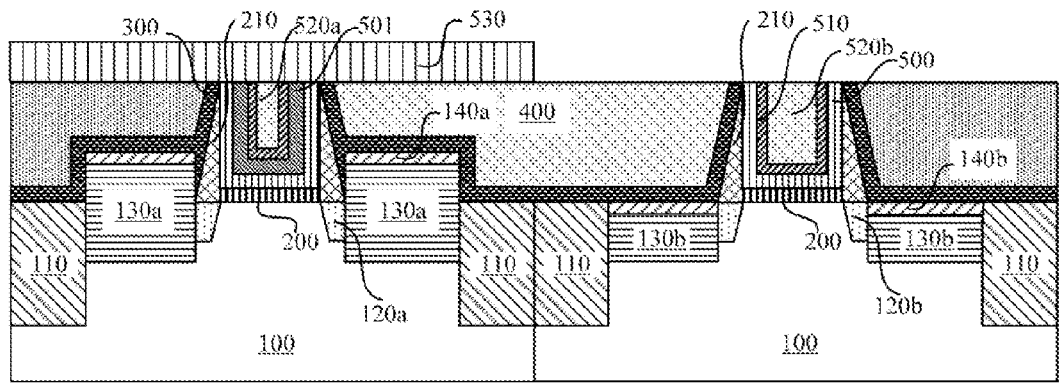
Figure 4G:
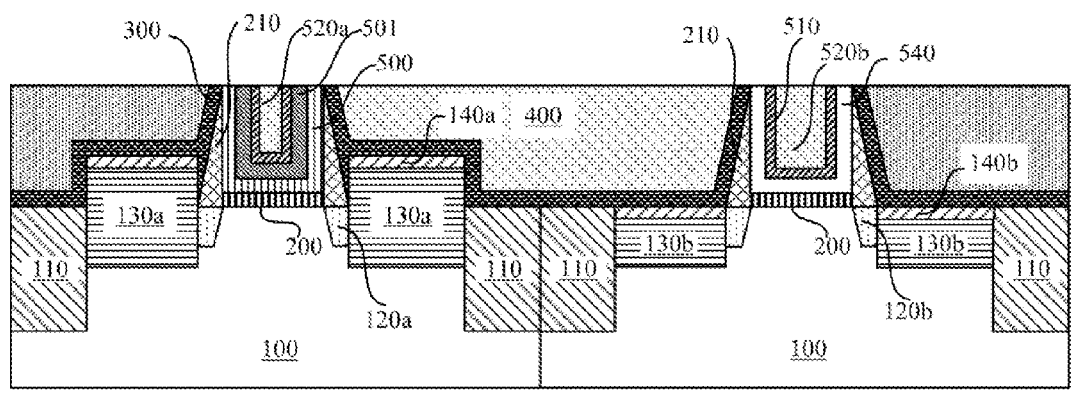
Figure 4H:
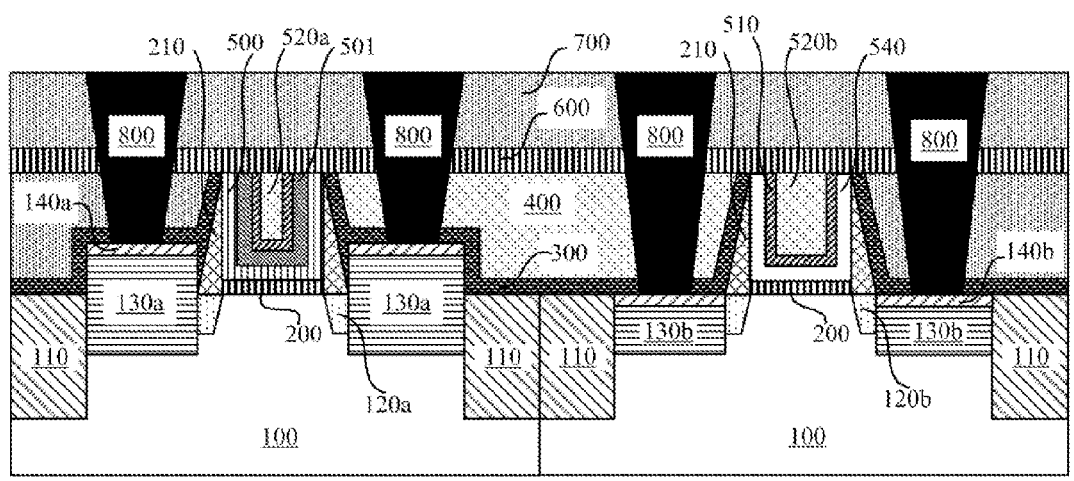

In another embodiment, preferably, after step S106, that is, after a first type metal work function modulation layer 500 is formed in the first gate trench 400a and the second gate trench 400b, a metal diffusion barrier layer 501 that covers the first type metal work function modulation layer 500 is formed in the first gate trench 400a. Specifically, as shown in FIG. 4(a), first, a metal diffusion barrier layer 501 is formed on the first type metal work function modulation layer 500 by means of deposition (e.g., PVD, ALD, CVD); then, as shown in FIG. 4(b), the metal diffusion barrier layer 501 in the second gate trench 400b is removed. The materials of the metal diffusion barrier layer 501 include $M_xM_y$, $M_xSi_yN_z$, $M_xAl_yN_z$ and $MaAl_xSi_yN_z$, in which M is Ta, Ti, Hf, Zr, Mo, W, or any other suitable metal element. It should be noted that the materials selected for the metal diffusion barrier layer 501 should be different from those for the second type work function metal diffusion source layer 510 in the subsequent steps. The metal diffusion barrier layer 501 has a thickness in the range of 1 nm to 15 nm. After the metal diffusion barrier layer 501 is formed, steps S107 to S110 are continued. That is, as shown in FIG. 4(c), a second type work function metal diffusion source layer 510 is formed in the first gate trench 400a and the second gate trench 400b to cover the metal diffusion barrier layer 501 and the first type metal work function modulation layer 500. Then, as shown in FIG. 4(d), a gap fill metal 520 is formed in the first gate trench 400a and the second gate trench 400b. Then, as shown in FIG. 4(e), the gap fill metal 520, the second type work function metal diffusion source layer 510, the metal diffusion barrier layer 501, and the first type metal work function modulation layer 500 are etched to form a first gate 520a and a second gate 520b in the first gate trench 400a and the second gate trench 400b, respectively. Then, as shown in FIG. 4(f), a heat insulation layer that shields the region of the first type device is formed and thermal annealing is conducted on the entire semiconductor structure. The region of the first type device is shielded by the heat isolation layer 530 and at the same time there is a metal diffusion barrier layer 502 which serves as an isolation between the second type work function metal diffusion source layer 510 and the first type metal work function modulation layer 500, thus more effectively preventing the metal ions in the second type work function metal diffusion source layer 510 from diffusing into the first type metal work function modulation layer 500 under thermal annealing effect. Since the region of the second type device is not shielded, the metal ions in the second type work function metal diffusion source layer 510 during the process of thermal annealing enters the first type metal work function modulation layer 500 thereunder, thus changing the work function of the first type metal work function modulation layer 500, which will be converted to a second type metal work function modulation layer 540 suitable for second type devices, as shown in FIG. 4(g). Finally, as shown in FIG. 4(h), according to the conventional process steps, a cap layer 600 and a second interlayer dielectric layer 700 are formed on the first interlayer dielectric layer 400, and a contact plug 800 throughout the second interlayer dielectric layer 700, the cap layer 600 and the first interlayer dielectric layer 400 is formed.

It should be noted that the method for manufacturing a metal gate provided in this invention is also applicable to semiconductor structures such as fin-type field effect transistor structures, tri-gate structure transistors, nano-transistor structures and the like. For the sake of simplicity, no discussion is made herein.

Compared with the prior art, the present invention has the following advantages:

(1) the first type metal work function modulation layer and the second type work function metal diffusion source layer are deposited in the entire region successively and then the region of the first type device is protected using a heat insulation layer (or together with a metal diffusion barrier layer) such that only the second type work function metal diffusion barrier layer in the region of the second type device is diffused during the process of subsequent thermal annealing, wherein the metal ions are diffused into the first type metal work function modulation layer, thus changing the work function of the first type metal work function modulation layer to allow it suitable for the metal work function modulation layer of a second type device. Therefore, there is no need for the present invention to selectively corrode the first type metal work function modulation layer according to the manner in the prior art, which avoids causing damage to the high K dielectric layer in the second type device.

(2) Since the second type metal work function modulation layer is converted from the first type metal work function modulation layer, there is no need to deposit the second type metal work function modulation layer onto the first type metal work function modulation layer according to the manner in the prior art, which also avoids the negative impact of one type of metal work function modulation layer on the threshold regulation of another type of device.

(3) The process is easy, which facilitates the manufacture.

Figure 3K:
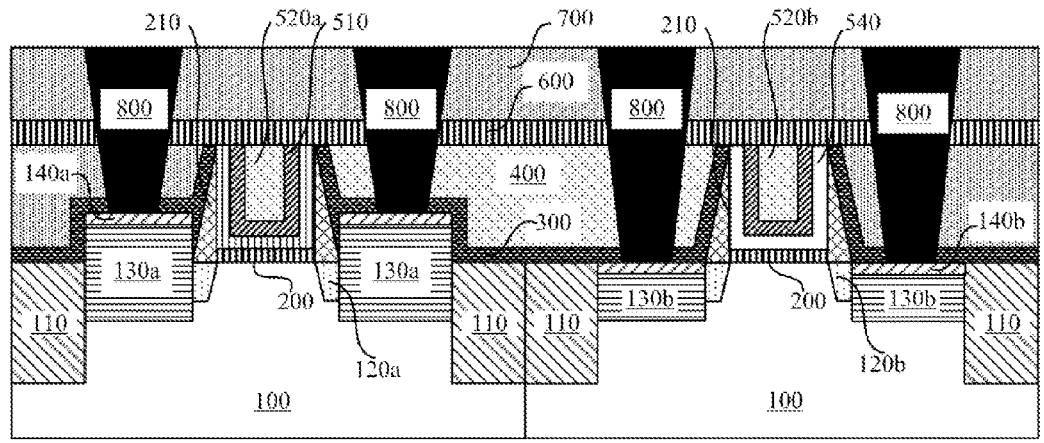

According to another aspect of the present invention, a CMOS device of a metal gate having different work functions is further provided, please refer to FIG. 3(k). As shown in the figure, the CMOS device comprises:

a substrate 100, and a first gate stack and a second gate stack on the substrate 100, wherein:

the first gate stack includes successively a gate dielectric layer 200, a first type metal work function modulation layer 500 and a first gate 520a in a bottom-up order;

the second gate stack includes successively a gate dielectric layer 200, a second type metal work function modulation layer 540 and a second gate 520b in a bottom-up order, characterized in that:

a second type work function metal diffusion source layer 510 is also present between the first type metal work function modulation layer 500 and the first gate 520a, and between the second type metal work function modulation layer 540 and the second gate 520b.

Specifically, in this embodiment, the substrate 100 is a silicon substrate (for example, a silicon wafer). According to the design to requirement generally known in the art (for example, P-type substrate or N-type substrate), substrate 100 may comprise various doping configurations. In other embodiments, the substrate 100 may comprise other basic semiconductors (such as materials of Groups III-V), e.g., germanium. Alternatively, the substrate 100 may comprise compound semiconductors such as silicon carbide, gallium arsenide, and indium arsenide. Typically, the substrate 100 may have but not limited to a thickness of about a few hundred microns, for example, a thickness in the range of 400 μm to 800 μm. There is an isolation region in the substrate 100, e.g., a shallow trench isolation (STI) structure 110, to facilitate electrical isolation of continuous field-effect transistor devices.

The first gate stack and the second gate stack are located on the substrate 100, wherein the first gate stack is corresponding to a first type device and the second gate stack is corresponding to a second type device. If the first type device is PMOS, then the second type device is NMOS; if the first type device is NMOS, then the second type device is PMOS.

As shown in FIG. 3(k), the first gate stack includes successively a gate dielectric layer 200, a first type metal work function modulation layer 500, a second type work function metal diffusion source layer 510, and a first gate 520a in a bottom-up order, wherein the second type work function metal diffusion source layer 510 is located on the bottom and sidewall of the first gate 520a, while the first type metal work function modulation layer 500 is located on the bottom and sidewall of the second type work function metal diffusion source layer 510.

The second gate stack includes successively a gate dielectric layer 200, a second type metal work function modulation layer 540, a second type work function metal diffusion source layer 510, and a second gate 520b in a bottom-up order, wherein the second type work function metal diffusion source layer 510 is located on the bottom and sidewall of the second gate 520b, while the second type metal work function modulation layer 540 is located on the bottom and sidewall of the second type work function metal diffusion source layer 510; wherein the second type work function metal diffusion source layer 510 comprises diffusion elements. The work function of the second type metal work function modulation layer 540 is adjusted by the above method provided in the present invention to allow it suitable for a second type device.

The materials of the gate dielectric layer 200 can be a high K dielectric, e.g., one of one of $HfO_2$, HfSiO, HfSiON, HfTaO, HfSiO, HfZrO, HfLaO, HfLaSiO, $Al_2O_3$, $La_2O_3$, $ZrO_2$, LaAlO, or a combination thereof, with a thickness in the range of 1 nm to 15 nm.

The first type metal work function modulation layer 500 and the second type metal work function modulation layer 540 can either be single-layer structures or multilayer structures. When the first type metal work function modulation layer 500 and the second type metal work function modulation layer 540 are multilayer structures, identical or different materials can be employed for different layers, wherein the materials employed for each layer in the first type metal work function modulation layer 500 and the second type metal work function modulation layer 540 are as follows:
(a) $M_xN_y$, $M_xSi_yN_z$, $M_xAl_yN_z$, and $MaAl_xSi_yN_z$, in which M is one of Al, Ta, Ti, Hf, Zr, Mo, W, Cu, or a combination thereof, or other appropriate metal elements;
(b) Co, Ni, Cu, Al, Pd, Pt, Ru, Re, Mo, Ta, Ti, Hf, Zr, W, Ir, Eu, Nd, Er, La, and the like;
(c) doped (a) materials with Co, Ni, Cu, Al, Pd, Pt, Ru, Re, Mo, Ta, Ti, Hf, Zr, W, Ir, Eu, Nd, Er, La, and the like implantation.

If the first type device is PMOS and the second type device is NMOS, then the first type metal work function modulation layer 500 has a work function of greater than 4.55 eV and the second type metal work function modulation layer 540 has a work function of less than 4.55 eV, vice versa.

The second type work function metal diffusion source layer 510 can either be a single-layer structure or a multilayer structure. When the second type work function metal diffusion source layer 510 is a multilayer structure, identical or different materials can be employed for different layers, wherein the materials employed for each layer in the second type work function metal diffusion source layer 510 are as follows:
(a) $M_xN_y$, $M_xSi_yN_z$, $M_xAl_yN_z$, and $MaAl_xSi_yN_z$, in which M is one of Al, Ta, Ti, Hf, Zr, Mo, W, Cu, or a combination thereof, or other appropriate metal elements;
(b) Co, Ni, Cu, Al, Pd, Pt, Ru, Re, Mo, Ta, Ti, Hf, Zr, W, Ir, Eu, Nd, Er, La, and the like;
(c) doped (a) materials with Co, Ni, Cu, Al, Pd, Pt, Ru, Re, Mo, Ta, Ti, Hf, Zr, W, Ir, Eu, Nd, Er, La, and the like inplantation.

It should be noted that the materials of the second type work function metal diffusion source layer 510 and the metal work function modulation layers (including the first type metal work function modulation layer 500 and the second type metal work function modulation layer 540) have the same selection range, but the diffusion source in the second type work function metal diffusion source layer 510 has a higher concentration than that of the corresponding element in the metal work function modulation layer.

The materials of the first gate 520a and/or the second gate 520b can be $M_xN_y$, $M_xSi_yN_z$, $M_xAl_yN_z$, and $M_aAl_xSi_yN_z$, in which M is one of Al, Ta, Ti, Hf, Zr, Mo, W, Cu, or a combination thereof; one of Co, Ni, Cu, Al, Pd, Pt, Ru, Re, Mo, Ta, Ti, Hf, Zr, W, Ir, Eu, Nd, Er, La, or any combination thereof; or metal alloy of Si, Ge and SiGe; or polycrystalline silicon, amorphous silicon, polycrystalline germanium, or polycrystalline silicon-germanium. The first gate 520a and/or the second gate 520b have a thickness in the range of 5 nm to 200 nm.

Preferably, as shown in FIG. 4(h), there is a metal diffusion barrier layer 501 present between the first metal work function modulation layer 500 and the second type work function metal diffusion layer 510, wherein the materials of the metal diffusion barrier layer 501 with a thickness in the range of 1 nm to 15 nm include: $M_xN_y$, $M_xSi_yN_z$, $M_xAl_yN_z$, and $MaAl_xSi_yN_z$, in which M is one of Al, Ta, Ti, Hf, Zr, Mo, W, Cu, or a combination thereof.

The first type device further comprises a spacer 210 around the first gate stack, a source junction extension 120a and a source/drain region 130a located on both sides of the first gate stack, and a contact layer 140a located on the source/drain region 130a. Likewise, the second type device further comprises a spacer 210 around the second gate stack, a source junction extension 120b and a source/drain region 130b located on both sides of the second gate stack, and a contact layer 140b located on the source/drain region 130b. Further, the CMOS device further comprises a contact etch stop layer 300, a first interlayer dielectric layer 400, a cap layer 600, a second interlayer dielectric layer 700 and a contact plug 800.

The CMOS device of a metal gate having different work functions provided in the present invention has the following advantages:
(1) in the prior art, the structure of the second type metal work function modulation layer located on the first type metal work function modulation layer is different. For the CMOS device provided in the present invention, the first type metal work function modulation layer and the second type metal work function modulation layer are located in the regions of different type devices, respectively, thereby effectively avoiding the negative impact of the second type metal work function modulation layer on the threshold regulation of the first type device.

The CMOS device is easier to manufacture.

Although the exemplified embodiments and the advantages thereof have been illustrated in detail, it is understood that any modification, replacement and change can be made to these embodiments without departing from the spirit of the invention and the scope defined in the attaching claims. As to other examples, a person skilled in the art can easily understand that the order of the process steps can be modified without falling outside the protection scope of the invention.

In addition, the application fields of the invention are not limited to the processes, mechanism, fabrication, material composition, means, methods and steps in the particular embodiments as given in the description. From the disclosure of the invention, a person skilled in the art can easily understand that, as for the processes, mechanism, fabrication, material composition, means, methods or steps present or to be developed, which are carried out to realize substantially the same function or obtain substantially the same effects as the corresponding examples described according to the invention, such processes, mechanism, fabrication, material composition, means, methods or steps can be applied according to the invention. Therefore, the claims attached to the invention are intended to encompass the processes, mechanism, fabrication, material composition, means, methods or steps into the protection scope thereof.

We claim:

1. A method for manufacturing a dual metal gate CMOS device, comprising the steps of:
   a) forming a first type metal work function modulation layer in a first gate trench and a second gate trench, wherein the first gate trench is used to form a gate of a first type device, and the second gate trench is used to form a gate of a second type device;
   b) forming a second type work function metal diffusion source layer in the first gate trench and the second gate trench;
   c) forming a gap fill metal in the first gate trench and the second gate trench;
   d) forming a heat isolation layer that shields the region of the first type device; and
   e) thermally annealing the region in which the first type device and the second type device are located such that metal ions in the second type work function metal diffusion source layer in the region of the second type device are diffused into the first type metal work function modulation layer, and the first type metal work function modulation layer is converted to a second type metal work function modulation layer.

2. The method according to claim 1, wherein prior to the step a), the method further comprises:
   providing a substrate;
   forming a first dummy gate stack and a second dummy gate stack on the substrate, each of the first dummy gate stack and the second dummy gate stack at least comprising a dummy gate, wherein the first dummy gate stack is used to form a gate of the first type device, and the second dummy gate stack is used to form a gate of the second type device;
   forming a source/drain region of the first type device on both sides of the first dummy gate stack, and forming a source/drain region of the second type device on both sides of the second dummy gate stack;
   forming an interlayer dielectric layer to cover the source/drain regions and the dummy gate stacks; and
   removing part of the interlayer dielectric layer to expose the dummy gates, and removing the dummy gates to form the first gate trench corresponding to the first dummy gate stack and the second gate trench corresponding to the second dummy gate stack.

3. The method according to claim 1, wherein:
   the material of the heat isolation layer comprises one of oxides, nitrides, Si:C, SiGe, amorphous silicon, polycrystalline silicon, germanium, $M_x$, $M_xN_y$, $M_xSi_yN_z$, $M_xAl_yN_z$, and $MaAl_xSi_yN_z$, or any combination thereof, wherein M is one of Al, Ta, Ti, Hf, Zr, Mo and W, Cu, or any combination thereof.

4. The method according to claim 1, wherein after the step a), the method further comprises:
   forming a metal diffusion barrier layer on the first type metal work function modulation layer in the first gate trench.

5. The method according to claim 4, wherein:
   the material of the metal diffusion barrier layer comprises one or more of $M_xN_y$, $M_xSi_yN_z$, $M_xAl_yN_z$, and $MaAl_xSi_yN_z$, wherein M is one of Al, Ta, Ti, Hf, Zr, Mo, W, and Cu, or any combination thereof.

6. The method according to claim 1, wherein:
   the thermal annealing comprises transient laser annealing, pulsed high-temperature annealing or furnace annealing.

7. The method according to claim 1, wherein the material of the first type metal work function modulation layer comprises:
   i) one or more of $M_xN_y$, $M_xSi_yN_z$, $M_xAl_yN_z$, and $MaAl_xSi_yN_z$, in which M is one of Al, Ta, Ti, Hf, Zr, Mo, W, and Cu, or any combination thereof;
   ii) Co, Ni, Cu, Al, Pd, Pt, Ru, Re, Mo, Ta, Ti, Hf, Zr, W, Ir, Eu, Nd, Er, and La; and/or
   iii) doped i) material with Co, Ni, Cu, Al, Pd, Pt, Ru, Re, Mo, Ta, Ti, Hf, Zr, W, Ir, Eu, Nd, Er, or La implantation.

8. The method according to claim 1, wherein:
   the first type device is a PMOS device, and the first type metal work function modulation layer has a work function of greater than 4.55 eV; and
   the second type device is an NMOS device, and the second type metal work function modulation layer has a work function of less than 4.55 eV.

9. The method according to claim 1, wherein the material of the second type work function metal diffusion source layer comprises:
   i) one or more of $M_xN_y$, $M_xSi_yN_z$, $M_xAl_yN_z$, and $MaAl_xSi_yN_z$, in which M is one of $Al_x$ Ta, Ti, Hf, Zr, Mo, W, and Cu, or any combination thereof;
   ii) one or more of Co, Ni, Cu, Al, Pd, Pt, Ru, Re, Mo, Ta, Ti, Hf, Zr, W, Ir, Eu, Nd, Er, and La; and/or
   iii) doped i) material with Co, Ni, Cu, Al, Pd, Pt, Ru, Re, Mo, Ta, Ti, Hf, Zr, W, Ir, Eu, Nd, Er, or La implantation;
   wherein the diffused element in the second type work function metal diffusion source layer has a higher concentration than that of the corresponding element in the first type metal work function modulation layer.

10. The method according to claim 1, wherein:
    the material of the gap fill metal are one or more of $M_xN_y$, $M_xSi_yN_z$, $M_xAl_yN$, and $MaAl_xSi_yN_z$, in which M is one of Al, Ta, Ti, Hf, Zr, Mo, and W, or a combination thereof; or
    the material of the gap fill metal are one of Co, Ni, Cu, Al, Pd, Pt, Ru, Re, Mo, Ta, Ti, Hf, Zr, W, Ir, Eu, Nd, Er, and La, or any combination thereof; or
    the material of the gap fill metal comprises a metal alloy of one or more of Si, Ge and SiGe; or
    the material of the gap fill metal comprises metal oxides conductors; or
    the material of the gap fill metal comprises one or more of polycrystalline silicon, amorphous silicon, polycrystalline germanium, and polycrystalline silicon-germanium.

* * * * *